United States Patent [19]

Tanaka et al.

[11] Patent Number: 5,661,307
[45] Date of Patent: Aug. 26, 1997

[54] ELECTRON BEAM LITHOGRAPHY SYSTEM

[75] Inventors: Kazumitsu Tanaka; Susumu Takashima; Junji Abe, all of Tokyo, Japan

[73] Assignee: Jeol Ltd., Tokyo, Japan

[21] Appl. No.: 719,868

[22] Filed: Sep. 25, 1996

[30] Foreign Application Priority Data

Sep. 25, 1995 [JP] Japan ................................. 7-246281

[51] Int. Cl.⁶ .................................................. H01J 37/30
[52] U.S. Cl. ......................................... 250/492.2; 250/398
[58] Field of Search ........................... 250/492.2, 492.22, 250/492.23, 398, 396 R, 423 F

[56] References Cited

U.S. PATENT DOCUMENTS 4,117,340  9/1978  Goto et al. ........................... 250/492.2
4,331,875  5/1982  Wolfe .................................. 250/492.2
5,196,707  3/1993  Gesley ................................ 250/492.2

OTHER PUBLICATIONS

"A thermally assisted field emission electron beam exposure system", H. Nakazawa et al., *J. Vac. Sci. Technol. B*, vol. 6, No. 6, Nov./Dec. 1988, pp. 2019–2022.

*Primary Examiner*—Kiet T. Nguyen
*Attorney, Agent, or Firm*—Webb Ziesenheim Bruening Logsdon Orkin & Hanson, P.C.

[57] ABSTRACT

An electron beam lithography system capable of forming an aperture image on a material to be patterned in such a way that the current density distribution throughout the whole image is uniform, the current density is high, and the resolution is high. The system has an electron gun comprising a plurality of needle-like cathodes arranged in an array forming field emission electron sources. Electrons are extracted from the cathodes.

6 Claims, 3 Drawing Sheets

ELECTRON BEAM LITHOGRAPHY SYSTEM

FIELD OF THE INVENTION

The present invention relates to an electron beam lithography system equipped with a field emission electron gun.

BACKGROUND OF THE INVENTION

Electron beam lithography systems have been used for fabrication of LSI, VLSI and ELSI (extra large scale integration) circuits.

An electron beam lithography system has an electron gun for producing an electron beam. The beam is focused onto a material to be patterned such that the beam hits the desired position on the material. Thus, an IC pattern is drawn on the material. Electron beam lithography systems of this kind are classified into two major classes: spot beam electron beam lithography system, where an electron beam focused to a spot scans a desired region on the material to draw a desired pattern; and shaped electron beam lithography system, where an apertured plate having an aperture of a given shape or given shapes is placed in electron optics and an image of the aperture is focused at a desired location on the material, thus drawing a desired pattern. Electron beam lithography systems of the shaped beam or area type are further classified into a fixed shaped electron beam lithography system equipped with a single apertured plate and a variable shaped electron beam lithography system having a deflector between plural apertured plates.

In the variable shaped electron beam lithography system, the electron beam passed through the upper aperture is appropriately deflected by the deflector over the lower apertured plate so that the beam having a desired cross-sectional shape passes through the lower aperture. The variable shaped electron beam lithography system is disclosed in U.S. Pat. No. 4,117,340. An electron beam lithography system equipped with both fixed and variable shaped beam systems has been proposed recently.

In the spot beam electron beam lithography system, images of the electron emission portions are focused to a spot on the material to be patterned. On the other hand, in the shaped electron beam lithography system, an aperture image conforming to the size of an aperture is focused onto a material to be patterned. Therefore, the shaped electron beam lithography system is capable of drawing a pattern with an electron beam current greater than that of the beam used by the spot beam electron beam lithography system and hence the former system provides a higher writing speed than the latter system. Consequently, the former system can obtain a higher throughput.

Normally, an electron beam lithography system uses a field emission emitter or heated lanthanum hexaboride ($LaB_6$) as an electron gun cathode. In the electron gun equipped with the field emission cathode, the electron-generating portion has a quite high brightness B (about $10^8$ A/cm².sterad.) and the spread of initial velocities $\Delta v$ is narrow. Also, the spread of current densities is narrow. So, the current densities on the material are high. On the other hand, in the electron gun equipped with the heated lanthanum hexaboride, the electron-generating portion has a low brightness B (about $10^6$ A/cm².sterad.) and the spread of the initial velocities $\Delta v$ is wide. So, current densities on the material are low.

Let $\alpha$ be one-half of the incident angle of the electron beam to the material to be patterned. Let B be the brightness of the electron-generating portion of the electron gun. The current density of the electron beam impinging on the material to be patterned is given by $$\rho = B\pi\alpha^2 \quad (1)$$

Let V be the accelerating voltage applied to the electron beam by the electron beam lithography system. The resolution S of the image on the material to be patterned is in proportion to $\Delta v/V$.

Where the field emission electron gun is used in the above-described spot beam electron beam lithography system, images of electron emission portions can be focused onto the material with sufficiently high current density (for example, 1,000 A/cm²) and with a high resolution S (on the order of 0.01 μm), because of high brightness and narrow velocity distribution. However, the diameter of the image focused onto the material is quite small, approximately 0.05 μm, for example, because of the very small area of electron emission portions. This makes it impossible to increase the writing speed. For this reason, a high throughput cannot be expected. If the beam diameter is increased by defocusing the image formed on the material, the resolution of the image and the current density will deteriorate. A spot beam electron beam lithography system using an electron gun consisting of a field emission electron gun is disclosed by H. Nakazawa, H. Takemura, M. Isobe, Y. Nakagawa, M. Hassel Shearer and W. Thompson "A thermally assisted field emission electron beam exposure system" in *J. Vac. Technol.* B6(6), November/December 1988, pp. 2019–2022.

Where an electron gun equipped with a $LaB_6$ cathode is used in the aforementioned shaped electron beam lithography system, an aperture image having a large size (for example, about 5 μm×5 μm) and exhibiting uniform current density distribution over the whole image can be focused onto the material. However, the brightness B of the electron-generating portion is low and so it is impossible to focus an aperture image of sufficiently large current density onto the material. Consequently, a very high throughput cannot be expected. Furthermore, the resolution of the aperture image is limited to about 0.1 μm.

When a field emission gun is employed in the aforementioned shaped electron beam lithography system, it is possible to focus an aperture image having a large size (for example, about 5 μm×5 μm) and a high resolution S (about 0.01 μm) can be focused onto the material. But it is impossible to focus a large aperture image with a sufficiently high current density. Hence, a high throughput cannot be expected.

SUMMARY OF THE INVENTION

It is an object of the present invention to provide a novel electron beam lithography system capable of forming a large aperture image on a material with uniform current density distribution throughout the whole image, with high current densities, and with high resolution.

An electron beam lithography system according to the invention comprises an electron gun for producing an electron beam having a cross section of an undetermined shape, an apertured plate having an aperture and acting to determine the shape of the cross section of the electron beam, a projection lens to focus images of the aperture onto a material to be patterned, a condenser lens disposed between the electron gun and the projection lens, and an electron beam deflector for determining a position at which the images of the aperture are focused on the material. The electron gun comprises field emission electron sources having a plurality of needle-like cathodes. The condenser lens focuses images of the electron emission portions of the gun at the front focal point of the projection lens.

Another electron beam lithography system according to the invention comprises an electron gun for producing an electron beam having a cross section of an undetermined shape, a beam cross-sectional shape-setting means, a projection lens, a condenser lens disposed between the electron gun and the projection lens, and a first electron beam deflector. The electron gun comprises field emission electron sources having a plurality of needle-like cathodes. The beam cross-sectional shape-setting means comprises a plurality of apertured plates located on an electron optical axis and a second electron beam deflector disposed between the apertured plates. The projection lens focuses images of an aperture in the apertured plate closer to a material onto the material to be patterned. The condenser lens focuses images of the electron emission portions of the gun at the front focal point of the projection lens. The first electron beam deflector determines a position at which the aperture images are focused on the material.

In one feature of the invention, the electron gun described above comprises a plurality of field emission electron sources consisting of a plurality of needle-like cathodes arranged on a substrate. An insulating layer and an anode are laminated in this order over the substrate. The insulating layer and the anode are provided with holes surrounding the cathodes.

In another feature of the invention, a stop plate for adjusting beam current is located at a position where images of the electron sources are focused.

Other objects and features of the invention will appear in the course of the description thereof, which follows.

DETAILED DESCRIPTION OF THE INVENTION

Figure 1:
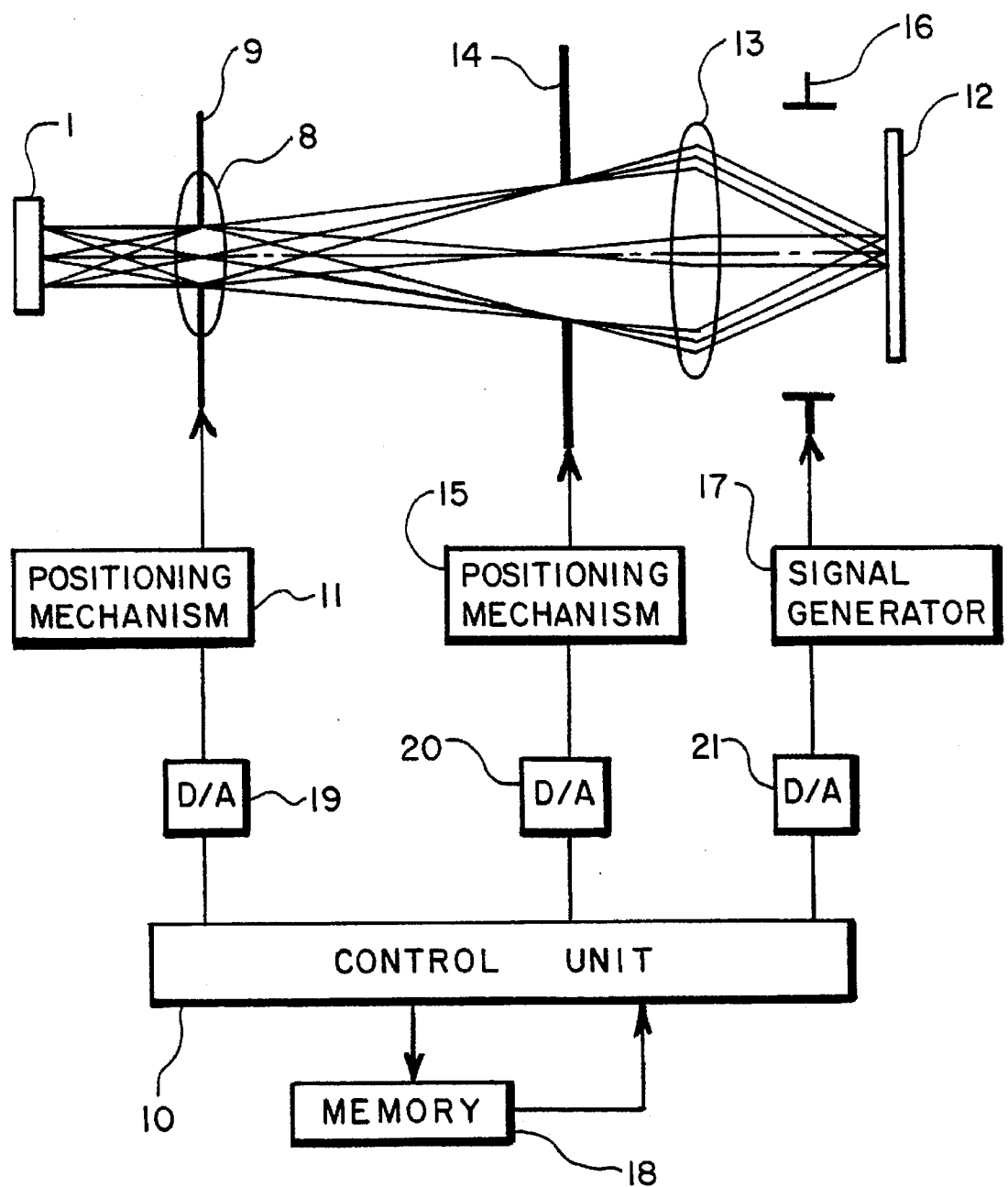
FIG. 1 is a schematic diagram of an electron beam lithography system according to the present invention.

Referring to FIG. 1, an electron beam lithography system embodying the concept of the present invention is schematically shown. This system has an electron gun 1 which is shown in FIG. 2 partially in cross section.

Figure 2:
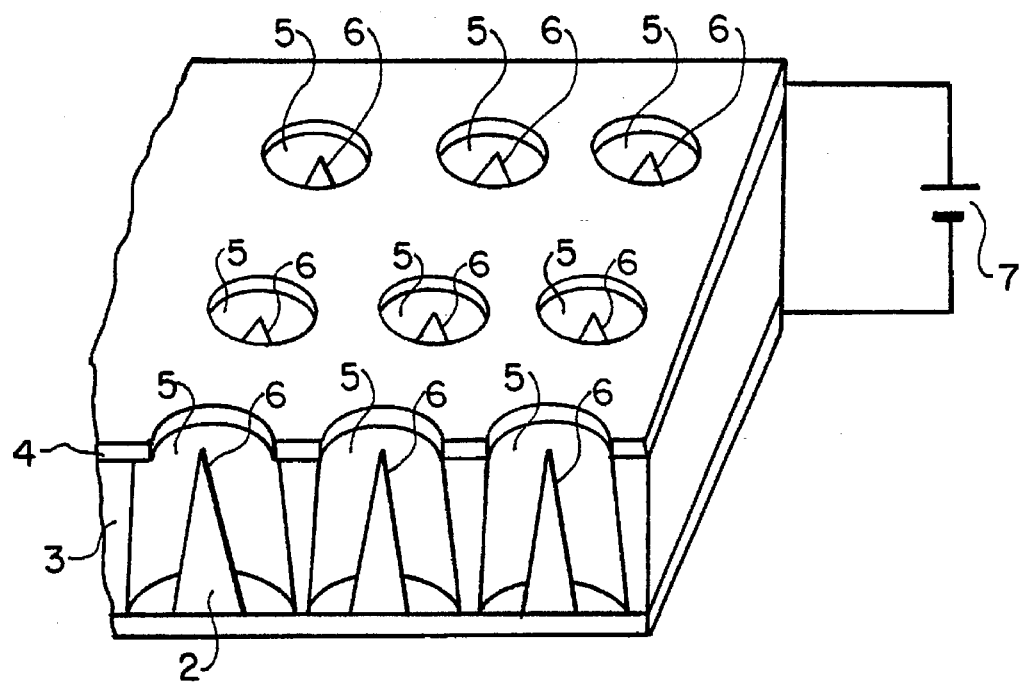
FIG. 2 is a fragmentary cross section of an electron gun used in the electron beam lithography system shown in FIG. 1.

Referring to FIG. 2, a substrate 2 is made of silicon or metal. An insulating layer 3 as consisting of $SiO_2$, for example, is formed on the substrate. An anode 4 formed by depositing a metal, for example, is formed on the insulating layer. Holes 5 extend through both insulating layer 3 and anode 4. For instance, the number of the holes 5 is 100, and they are arranged in rows and columns and the holes 5 are spaced about 10 µm from each other. A needle-like cathode, or chip, 6 is formed in each hole over the substrate 2. These needle-like cathodes are fabricated in the manner described below.

The insulating layer 3 and the anode 4 are formed over the substrate 2 as described above. Then, the holes 5 are formed. Under this condition, vapor of a metal such as tungsten or silicon is deposited on the substrate from above the anode 4 through the holes 5 by a well-known evaporation method. As a result, cathodes resembling needles are formed in the holes. Thereafter, an ion beam is made to irradiate each hole, thus etching the cathodes and making sharp points on the top of the cathodes. In this way, the needle-like cathodes 6 as shown in FIG. 2 are formed over the substrate 2. Instead of the evaporation, a well-known epitaxial method or chemical etching method may be used to form the needle-like cathodes over the substrate.

A voltage source 7 applies a positive voltage on to the anode 4 against the substrate 2.

Figure 3:
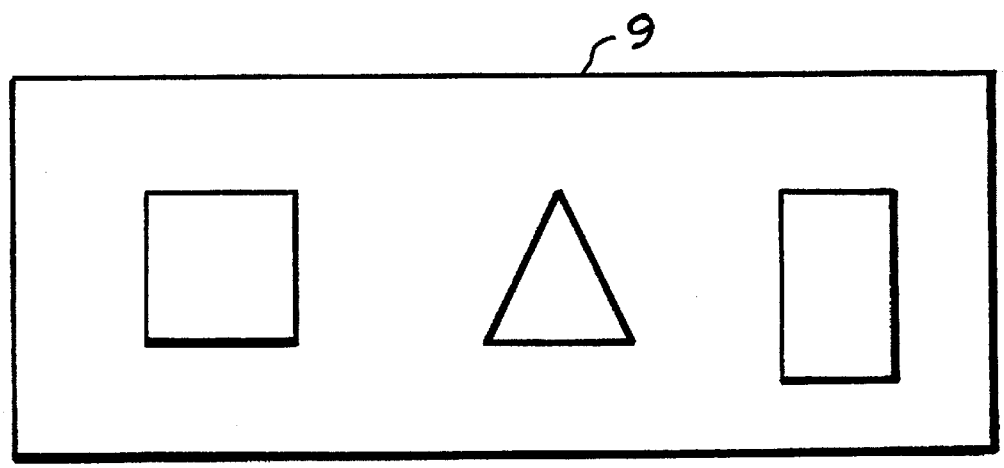
FIG. 3 is a front elevation of an apertured plate for use in an electron beam lithography system according to the invention.

Referring back to FIG. 1, a condenser lens 8 focuses images of the electron emission portions of the electron gun 1 at the front focal point of a projection lens 13 (described later). An apertured plate 9 is disposed inside or close to the condenser lens 8 so as to intersect the optical axis of the condenser lens 8 perpendicularly. The apertured plate 9 is provided with arbitrary apertures as shown in FIG. 3. The apertured plate 9 is capable of being moved in a plane perpendicular to the optical axis by a positioning mechanism 11 under instructions from a control unit 10 such that any one of the apertures is brought to the optical axis. The apertured plate 9 may be positioned at any arbitrary position between the condenser lens 8 and the projection lens 13.

This projection lens 13 focuses images of the aperture onto a material 12 to be patterned and, at the same time, collimates the beam impinging on the material 12, the beam forming the images of the electron emission portions focused by the condenser lens 8. A current-adjusting stop plate 14 is located at the front focal point of the condenser lens 8. The images of the electron emission portions are focused at this front focal point of the condenser lens 8. The stop plate 14 controls the amount of the electron beam reaching the material 12. The diameter of the stop in the stop plate 14 is appropriately varied by a beam current control positioning mechanism 15 which receives instructions from the control unit 10. The stop plate 14 may be a plate provided with a plurality of holes of different diameters, and the holes are arranged along a straight line. The plate can be moved along the straight line. Alternatively, the stop plate 14 may be a lamination of two plates each provided with a single rectangular hole. These two plates can be shifted from each other. If the stop plate 14 for adjusting the current is located outside the position where the images of the electron emission portions are focused, then the current density distribution of the aperture images focused onto the material will not be uniform.

A positioning deflector 16 controls the position on the material at which the aperture images are focused by the projection lens 13. The deflector 16 is operated by a beam position signal generator 17 under control of the control unit 10. Data about patterns is stored in a memory 18. The system further includes D/A converters 19, 20 and 21.

In the operation of the electron beam lithography system constructed as described above, if the voltage source 7 of the electron gun 1 applies a voltage, for example, about +1,000 V, between the anode 4 and the substrate 2, then an electric field is set up between them. This field extracts electrons from the chips 6 of the electron gun 1. The chips 6 form field emission electron sources. The ejected electrons are accelerated toward the material by an accelerating voltage, for example, of several kilovolts, applied between an accelerating electrode (not shown) and the substrate 2. Images of the electron emission portions of the chips are focused at the position of the current-adjusting stop plate 14 by the condenser lens 8. An instruction for selecting an aperture is sent from the control unit 10 to the positioning mechanism 11 via the D/A converter 19 according to the pattern data from the memory 18. Therefore, the apertured plate 9 is moved in such a way that a desired aperture is located on the optical axis. Accordingly, electrons ejected from the electron emission portions of the chips pass through the selected aperture. The shape of the cross section of the electron beam conforms to the shape of this aperture. The images of the aperture are focused onto the material 12 by the projection lens 13. That is, aperture images which are equal in number with the chips are superimposed and focused onto the material. At the same time, the images of the electron emission portions are focused at the front focal point of the projection lens 13. Therefore, the projection lens collimates the beam creating the images of the electron emission portions. An instruction indicating an irradiating position is sent from the control unit 10 to the positioning deflector 16 via the D/A converter 21 and also via the beam position signal generator 17 according to pattern data from the memory 18. Since the electron beam passed through the projection lens 13 undergoes given deflection by the deflector 16, the aperture images are focused at a given position on the material 12. The beam current density of the composite aperture image focused onto the material 12 is controlled by positioning mechanism 15 adjusting the diameter of the stop in the stop plate 14 described above.

In this way, the electron beam lithography system comprises the electron gun comprising plural field emission electron sources, the apertured plate for determining the shape of the cross section of the electron beam emitted by the electron gun, the projection lens for focusing images of an aperture in the apertured plate onto the material to be patterned, and the condenser lens disposed between the electron gun and the projection lens and acting to focus images of the electron emission portions of the field emission electron sources at the front focal point of the projection lens. The aperture images are superimposed at a given position on the material and brought to a focus. Consequently, a large focused composite aperture image which has a size of about 5 μm×5 μm, for example, exhibits uniform current density distribution throughout the whole composite image, and has high current density of about 100 A/cm$^2$, for example, and has high resolution of about 0.01 μm is obtained.

In the above example, the apertured plate is formed with plural apertures. If only a given apertured plate is employed, then an apertured plate having only one aperture may be used. In this case, the positioning mechanism 11 is dispensed with. Also in the above example, the apertured plate is moved by the positioning mechanism to select a desired aperture. A deflector for selecting a desired aperture may be mounted between the electron gun and the apertured plate. An instruction for selecting a desired aperture is sent to the deflector. The electron beam from the electron gun is appropriately deflected so that the beam illuminates the desired aperture. Furthermore, in the above example, the electron gun has 100 field emission electron sources. The present invention is not limited to this number.

Figure 4:
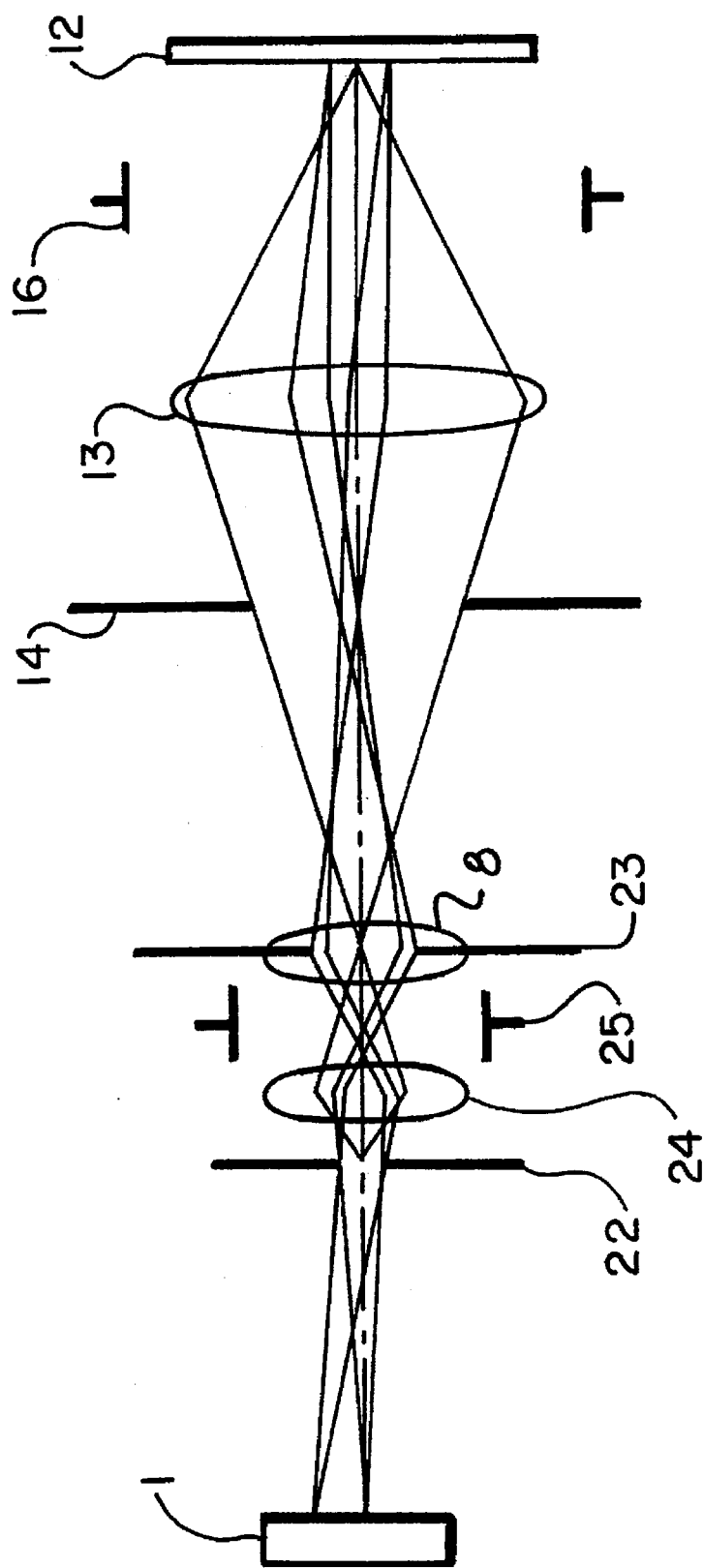
FIG. 4 is an electron optical ray diagram of another electron beam lithography system according to the invention.

Referring to FIG. 4, the present invention is also applicable to a charged particle beam lithography system comprising a plurality of apertured plates each provided with a rectangular or square aperture and a deflector disposed between the apertured plates. The deflector is used to determine the shape and size of the cross section of an electron beam. The beam passed through the upper aperture is appropriately deflected by the deflector and directed at the lower aperture. The electron beam having given shape and size is produced from the lower aperture and focused onto the material. The upper and lower apertured plates are indicated by 22 and 23, respectively. The system further includes a shaping lens 24 and a shaping deflector 25. The projection lens 13 collimates the beam which goes from images of electron sources to the material 12. At the same time, the projection lens 13 focuses images of the lower aperture onto the material.

Having thus described our invention with the detail and particularity required by the Patent Laws, what is desired protected by Letters Patent is set forth in the following claims.

What is claimed is:

1. An electron beam lithography system comprising:
an electron gun composed of field emission electron sources having a plurality of needle-like cathodes, said electron gun producing an electron beam having a cross section of a shape;
an apertured plate for determining the shape of the cross section of the electron beam produced by said electron gun;
a projection lens for focusing images of an aperture in said apertured plate onto a material to be patterned;
a condenser lens disposed between said electron gun and said projection lens and acting to focus images of electron emission portions of said electron gun at the front focal point of said projection lens; and
an electron beam deflector for determining a position at which the images of the aperture are focused on said material.

2. An electron beam lithography system comprising:
an electron gun composed of field emission electron sources having a plurality of needle-like cathodes;
a beam cross-sectional shape-setting means comprising a plurality of apertured plates disposed on an electron optical axis and a first electron beam deflector disposed between said apertured plates, one of said apertured plates being located closer to a material to be patterned than the other apertured plate;
a projection lens for focusing images of an aperture in the apertured plate closer to said material onto said material;
a condenser lens disposed between said electron gun and said projection lens and acting to focus images of electron emission portions of said electron gun at the front focal point of said projection lens; and
a second electron beam deflector for determining a position at which the images of the aperture are focused on said material.

3. The electron beam lithography system of claim 1 or 2, wherein said field emission electron sources of said electron gun comprise a substrate, a plurality of needle-like cathodes arranged on said substrate, an insulating layer formed over said substrate, an anode formed over said insulating layer, a plurality of holes extending through both said insulating layer and said anode and surrounding said cathodes, respectively.

4. The electron beam lithography system according to claim 3, wherein the needle-like cathodes are arranged in an array spaced substantially equally from each other.

5. The electron beam lithography system according to claim 4, wherein the needle-like cathodes are spaced about 10 μm from each other.

6. The electron beam lithography system of claim 1 or 2, further comprising a stop plate for adjusting current of said electron beam, said stop plate being located at a position where images of said electron emission portions are focused.

* * * * *